United States Patent [19]

McConnell et al.

[11] Patent Number: 4,778,532
[45] Date of Patent: Oct. 18, 1988

[54] PROCESS AND APPARATUS FOR TREATING WAFERS WITH PROCESS FLUIDS

[75] Inventors: Christopher F. McConnell, Gulph Mills; Alan E. Walter, Exton, both of Pa.

[73] Assignee: CFM Technologies Limited Partnership, Penllyn, Pa.

[21] Appl. No.: 765,294

[22] Filed: Aug. 13, 1985

Related U.S. Application Data

[63] Continuation-in-part of Ser. No. 747,894, Jun. 24, 1985, abandoned, which is a continuation-in-part of Ser. No. 612,355, May 21, 1984, abandoned.

[51] Int. Cl.$^4$ .............................................. B08B 7/04
[52] U.S. Cl. ...................................... 134/10; 134/18; 134/25.1; 134/25.4; 134/26; 134/28; 134/29; 134/30; 134/31; 417/122; 210/739
[58] Field of Search ............... 134/3, 10, 18, 25.1, 134/25.4, 26, 28, 29, 30, 31; 417/122, 118, 125; 210/739, 749, 750, 751, 758, 759, 760, 767

[56] References Cited

U.S. PATENT DOCUMENTS

| | | | |
|---|---|---|---|
| 539,074 | 5/1895 | Morrow | 417/122 |
| 539,075 | 5/1895 | Morrow | 417/122 |
| 728,148 | 5/1903 | Wever | 417/118 |
| 1,066,993 | 7/1913 | Carey | 103/42 |
| 1,318,160 | 8/1919 | Bianchini | 417/122 |
| 1,845,139 | 6/1929 | Exley | 417/122 |
| 2,180,274 | 6/1938 | Bentley | 417/125 |
| 3,005,417 | 10/1961 | Swaney | 103/238 |
| 3,437,543 | 4/1969 | Winings | 156/345 |
| 3,607,549 | 9/1971 | Bielefeld et al. | 156/345 |
| 3,632,462 | 4/1972 | Barrington | 156/345 |
| 3,813,311 | 5/1974 | Beck | 156/17 |
| 3,871,914 | 3/1975 | Goffredo et al. | 134/109 |
| 3,957,531 | 5/1976 | Tipping et al. | 134/11 |
| 3,964,957 | 6/1976 | Walsh | 156/345 |
| 3,977,926 | 8/1976 | Johnson, Jr. et al. | 156/17 |
| 4,017,343 | 4/1977 | Haas et al. | 156/642 |
| 4,056,428 | 11/1977 | Harada et al. | 156/642 |
| 4,079,522 | 3/1978 | Ham | 34/1 |
| 4,105,468 | 8/1978 | Geshner et al. | 134/3 |
| 4,159,917 | 7/1979 | Gluck | 134/3 |
| 4,169,807 | 10/1979 | Zuber | 252/171 |
| 4,323,452 | 4/1982 | Witzenbury | 210/188 |
| 4,408,960 | 10/1983 | Allen | 417/59 |
| 4,426,246 | 1/1984 | Kravitz et al. | 156/643 |
| 4,479,849 | 10/1984 | Frantzen | 134/10 |
| 4,519,846 | 5/1985 | Aigo | 134/30 |
| 4,589,926 | 5/1986 | Holmstrand | 134/30 |

Primary Examiner—H. M. S. Sneed
Assistant Examiner—Sharon T. Cohen
Attorney, Agent, or Firm—Panitch Schwarze Jacobs & Nadel

[57] ABSTRACT

Contamination of wafers is reduced by an enclosed full-flow method and apparatus for the cleaning and other wet processing of semiconductor wafers. Process fluids flow sequentially and continuously past the wafers such that the processing does not require movement or operator handling of the wafers between processing steps. The vessel containing the wafers is hydraulically full during each process step. Wafers may be cleaned using a hot corrosive fluid, such as sulfuric acid; rinsed using high purity water at high flow rates; and dried using a drying fluid such an isopropanol. In addition, chemical reagents such as dilute hydrofluoric acid or hydrogen peroxide may be precisely mixed in situ and applied to the wafer surface for a precisely controlled period, by injecting concentrated reagent into rinse water purified by multipass filtration.

58 Claims, 2 Drawing Sheets

PROCESS AND APPARATUS FOR TREATING WAFERS WITH PROCESS FLUIDS

CROSS REFERENCE TO RELATED APPLICATIONS

This application is a continuation-in-part of copending application Ser. No. 747,894, filed June 24, 1985 for, "Process and Apparatus For Treating Semiconductor Wafers," now abandoned which is a continuation-in-part of copending application Ser. No. 612,355, filed May 21, 1984, now abandoned "Vessel and System for Treating Wafers with Fluids," and is related to copending application Ser. No. 747,895, filed June 24, 1985 now abandoned "Vessel and System For Treating Wafers with Fluids." The disclosure of each of these copending applications is incorporated herein by reference.

BACKGROUND OF THE INVENTION

1. Field of the Invention

This invention relates to the manufacture of electronic components. More specifically, this invention relates to the manufacture of semiconductor components, and in particular to the preparation of semiconductor wafers prior to high temperature processing steps, such as diffusion, ion implantation, epitaxial growth, and chemical vapor deposition steps, and especially to methods and apparatus for the prediffusion cleaning of semiconductor wafers.

2. Brief Description of the Prior Art

In the fabrication of semiconductor wafers several proces steps require contacting the wafers with fluids. Examples of such process steps include etching, photoresist stripping, and prediffusion cleaning. Often the chemicals utilized in these steps are quite dangerous in that they may be strong acids, alkalis, or volatile solvents.

The equipment conventionally used for contacting semiconductor wafers generally consists of a series of tanks or sinks into which racks of semiconductor wafers are dipped. Wafer carriers are described, for example, in U.S. Pat. Nos. 3,607,478, 3,964,957 and 3,977,926. Such conventional wet processing apparatus poses several difficulties.

Since the tanks are open to the atmosphere, airborne particulates can enter into the process solutions. Through surface tension these particles are easily transferred to the wafer surfaces as the wafers are dipped into and lifted out of the sinks. This particulate contamination is extremely detrimental to the microscopic circuits which the wafer fabrication process creates. It is especially important to minimize particulate contamination during prediffusion cleaning.

Also, since the process chemical tanks are open, operators are exposed to the dangerous chemicals. This is a recognized safety concern. Furthermore, the chemicals must be regularly replaced with new solutions and this is generally accomplished by aspirating the solution out of the sink and pouring fresh solution from a bottle into the sink. Clean room operators usually wear face masks, gauntlet gloves, and chemical aprons to prevent injury during the manual replacement of process fluids.

Process disadvantages are also apparent for the sink-type method. As the chemicals age, they become contaminated with impurities from the air and from the wafers. The treatment of the last batch of wafers prior to fluid rejuvenation may not be as effective as treatment of the first batch of wafers in a new solution. Non-uniform treatment is a major concern of semiconductor process engineers.

Conventional wet process station sinks are characterized by stagnant conditions. Chemical process reactions occur at the surface of the wafer and stagnant conditions yield boundary-layer or "filming" phenomena which result in certain areas of the wafer receiving less chemical action than others. This is undesirable and could be particularly crucial in an etching operation. Good temperature control may also suffer because of stagnant conditions. Wet process equipment manufacturers have attempted to incorporate agitating means to circumvent these problems. One method attempting to overcome non-uniform etching is disclosed in U.S. Pat. No. 3,437,543.

After fluid processing the wafers normally need to be dried. This can be a particularly challenging process because it is important that no contamination be created during the drying process. Evaporation is undesirable since it often leads to spotting or streaking. Even the evaporation of ultra high purity water can lead to problems because such water is very aggressive to the wafers' surfaces and will dissolve traces of silicon and silicon dioxide. Subsequent evaporation will leave residues of the solute material on the wafer surface. Contamination and other causes of semiconductor failure are discussed, for example, in J. Schadel, "Device Failure Mechanisms In Integrated Circuits," *Solid State Devices* 1983 Conf. Ser. No. 69 (Institute of Physics, London 1984) 105–120.

A device know as a spin-rinser-drier is often used to dry wafers without water evaporation. These machines utilize centrifugal force to "throw" the water off the wafer surfaces. Problems can arise with wafer breakage because of the mechanical stress placed on the wafers, particularly with larger wafer sizes. Manufacturers are also challenged to minimize particulate generation in these usually somewhat complicated mechanical devices. Notwithstanding this, some manufacturers have extended the spin-rinser-drier technology to general fluid processing.

Machines known as "acid processors" are now available which spray the process fluids onto wafer surfaces. These machines offer the advantage of conserving chemical reagents while at the same time permitting each batch of wafers to be exposed to fresh solutions. Just as the shower was an advance over taking a bath, the acid process is an advance over the sink method. Yet several difficulties have prevented acid processors from gaining widespread use.

The difficulties with spin-rinser-driers in terms of particle generation and mechanical complexity are compounded in acid processors. Instead of just high purity water, acid processors must deal with the aggressiveness of hot corrosive acid used in fluid processing. The problems of mechanial breakdown and particulate generation are not ameliorated by use of acid processors instead of spin-rinser-driers.

Spray methods also introduce new process difficulties. Because only a small amount of reagent is utilized, it is nearly impossible to achieve high temperature processing. In prediffusion cleaning, for example, it is desirable to expose the wafers to concentrated sulfuric acid at a temperature between 80 to 150 degrees centigrade. Because the heat capacity of the sprayed solution is not very great, especially relative to the wafers themselves, it is nearly impossible to achieve the desired temperature on the wafer surface. The uniformity and control of temperature in acid processors is questionable. Similarly, it is difficult to achieve uniformity and control of processes such as hydrofluoric acid etching in which a relatively fast chemical reaction is taking place.

Even safety concerns are not obviated by enclosed acid processors. The spray nozzles of these machines use relatively high chemical pressures to achieve the correct spray pattern. Anytime such dangerous chemicals are pressurized, there is the possibility of an accident.

What is needed in the area of semiconductor wet processing is an apparatus and process which can bring process chemicals into contact with semiconductor wafers in such a manner that: (a) atmospheric contamination is avoided, (b) personnel exposure to the chemicals is minimized, (c) uniform treatment of the wafer is promoted, (d) fast and effective heat transfer is allowed, (e) stagnant conditions are minimized and "filming" effects are avoided, (f) the machine is mechanically simple, and (g) aggressive chemicals are handled safely.

SUMMARY OF THE INVENTION

The present process and apparatus provide several advantages over prior art processes and apparatus for contacting wafers with process fluids in the production of electronic components. For example, when a series of process fluids is to be used, such as in the prediffusion cleaning of wafers, the present invention does not require the movement of wafers from one process fluid to another. This reduces the likelihood of contamination by airborne particles. Nor does the present invention require handling by a human or robotic operator of the wafers between the steps of a multi-step fluid process such as prediffusion cleaning. This similarly reduces the likelihood of contamination.

Further, the present apparatus and process provide good heat transfer between process chemicals and wafers. Another important advantage lies in the ability of the present process and apparatus to provide especially uniform exposure of the wafers to reactive reagent chemicals at uniform concentrations for precisely limited periods of time. Another significant advantage is the ability of the present apparatus and process to provide a high quality rinsing fluid, such as water, having both low suspended solids and low dissolved impurities, for use in processing the wafers. Significant also is the ability of the present invention to provide high flow rates of this rinsing fluid to rinse the wafers and to precisely dilute concentrated chemical reagents such as hydrofluoric acid etchant.

Yet another advantage of the present invention is the ability to provide quality drying fluids, such as steam, to displace residual rinsing fluid, such as water, on the surface of the wafers. Another advantage lies in the reduction of the quantities of hazardous process fluids used due to recirculation of the process fluids. The present invention reduces the risk of introducing contaminants associated with prior art processes while it simultaneously improves the yield of non-defective semiconductor devices. These and other advantages and objects of the present invention will be evident from the description below.

It has now been discovered that a semiconductor wafer wet processing system which improves yield, contamination control, reproducibility, safety, and maintainability and simultaneously reduces waste generation is provided by an enclosed full-flow method wherein process fluids flow sequentially and continuously past the wafers and which comprises the step of (a) contacting the wafers with at least one chemical reagent, and (b) removing the chemical reagent from the wafers with a rinsing fluid.

This processing does not require movement or operator handling of the wafers between the steps. The vessel containing the wafers is hydraulically full during each process step. At those times at which a process fluid is not being used to contact the wafers, the non-contacting process fluid may be continuously recirculated. Preferably the transition between the chemical reagent and the rinsing fluid occurs without a intermediate fluid such as ambient air contacting wafers.

The present invention also provides apparatus for the non-static continuous flow wet processing of wafers comprising (a) vessel means for supporting the wafers in a closed circulation process stream wherein process fluids may sequentially flow past the wafers, (b) means for supplying at least one chemical reagent to the process stream for removing contaminants from the wafers, and means for withdrawing the chemical reagent from the process stream, (c) means for supplying a rinsing fluid to the process stream for removing other fluids from the wafers, and means for withdrawing the rinsing fluid from the process stream, and (d) means for supplying a drying fluid to the process stream for removing other fluids from the wafers, and means for withdrawing the drying fluid from the process stream.

BRIEF DESCRIPTION OF THE DRAWINGS

The foregoing summary, as well as the following detailed description, will be better understood when read in conjunction with the appended drawings. For the purpose of illustrating the invention, there are shown in the drawings embodiments which are presently preferred, it being understood, however, that this invention is not limited to the precise arrangements and instrumentalities show in the drawings.

DETAILED DESCRIPTION OF THE INVENTION

Figure 1:
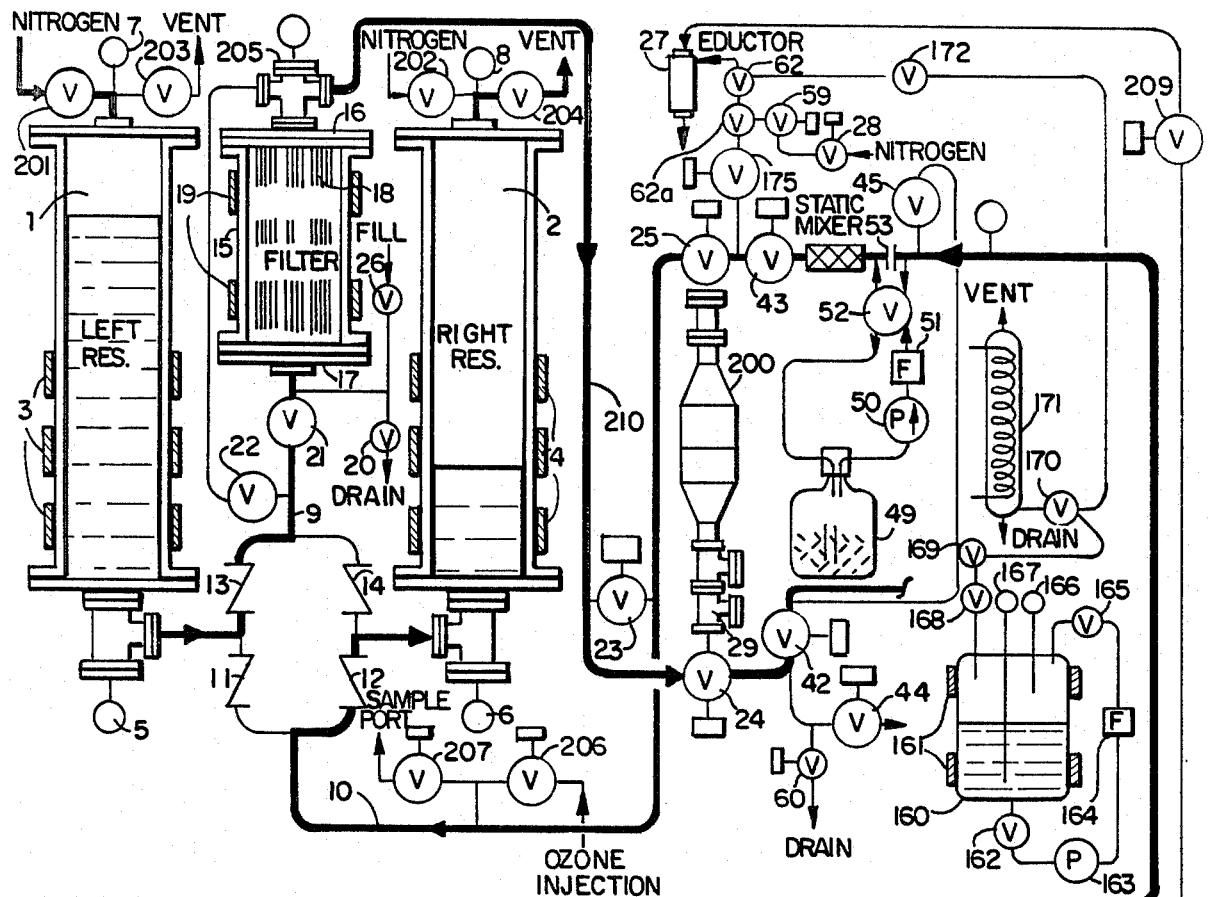
FIG. 1 schematically illustrates a preferred embodiment of the apparatus of the present invention.
Figure 1:
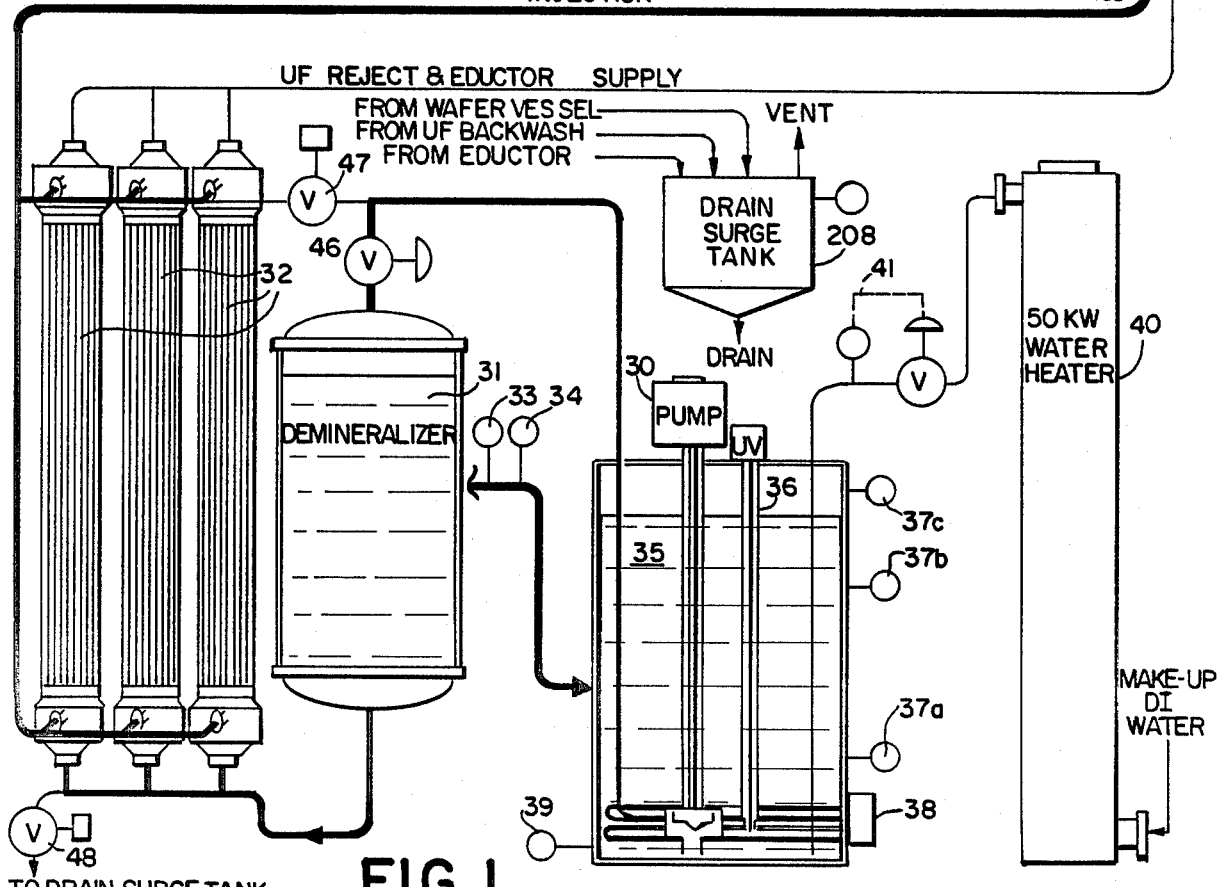

A preferred embodiment of the apparatus of the present invention is illustrated in FIG. 1. The processes of the present invention are described by reference to the apparatus of FIG. 1; however, the apparatus of FIG. 1 is merely illustrative, and other apparatus may be employed to perform these processes.

Wafers to be treated by the process of the present invention are present within an enclosed wafer vessel 200, preferably such as disclosed in copending U.S. patent applications Ser. Nos. 747,894, and 747,895, filed June 24, 1985 and 612,355, filed May 24, 1984, and as illustrated in FIG. 1 as extending between upper-three way valve 25 and lower threeway valve 24. Preferably, the wafer vessel is installed within a clean room in order to provide the cleanest possible environment when the vessel is opened prior or subsequent to processing of the wafers contained therein. The remainder of the apparatus may be located outside the clean room in order to provide easy access for maintenance and to reduce the amount of relatively expensive clean room space which must be used to contain the apparatus.

In addition to the wafer vessel and the wafer carriers disclosed in the above-identified copending applications, enclosed wafer vessels of other designs may be used. However, it is important for the processes of the present invention that the wafer vessel be closed. That is, the wafer vessel should not be open to the ambient atmosphere except when it is opened to load or unload wafers. The design of the wafer vessel must also be such that the design permits it to become hydraulically full of fluid during the processes of the present invention. By "hydraulically full" is meant that that the wafer vessel becomes completely filled with process fluid. By "process fluid" is meant a gas or a liquid which contacts the wafers. The vessel design should not allow residual ambient atmosphere to be trapped within the vessel after the vessel is closed and filled with process fluid. Similarly, the vessel design should be such that when process fluids are changed during the course of treating the wafers, residual prior fluid is not trapped within the vessel for any significant time after the flow of the next process fluid through the vessel is initiated. Thus, the vessel should not have blind spots, dead-ends, interior surface irregularities or the like where a process fluid or ambient atmosphere could be trapped. These characteristics are undesirable because they increase the likelihood of wafer surface contamination, reduce the efficiency of treatment processes, and reduce the precision with which the individual processes of the present invention may be varied.

It is preferred that corrosive fluid, such as cleaning fluid, contact the wafer as a single fluid phase, such as liquid, and be substantially free of phase boundaries, such as gas/liquid interfaces which form where gas bubbles are suspended in a liquid.

The apparatus and processes of the present invention may be used, for example, in lightly etching the wafer surfaces to remove any thin unwanted oxide layer from the silicon surface of wafers prior to oxidizing the surface of the silicon to yield a surface layer of silicon dioxide or prior to ion implantation. The oxidation of the silicon surface is a typical initial step in the manufacturing process referred to in the semiconductor art as a "diffusion step." In addition to oxidation of the silicon surface to form silicon dioxide, a "diffusion step" may in addition successively include photomasking, oxide etching, photoresist removal, and/or diffusion of an impurity atom or ion into the silicon substrate via high temperature diffusion or ion implantation. Semiconductor fabrication is described generally, for example, in P. Gise et al., *Semiconductor and Integrated Circuit Fabrication Techniques* (Reston Publishing Co. Reston, VA 1979).

The present invention may also be employed in the wet processing of wafers which occurs during such a "diffusion step." For example, the present invention may be used in oxide etching. In this case, typical etchants for silicon dioxide such as hydrofluoric acid, or ammonium fluoride buffered hydrofluoric acid, may be used. Similarly, the present invention may be used with chemical reagents to remove the photoresist material. Depending on the concentration of reagents required, the number of silicon wafers which must be processed, the desirability of recycling the processing fluids, and similar factors, either the corrosive fluid "pumping" process and apparatus of the present invention may be used or the concentrated reagent injection and dilution process apparatus may be employed.

In addition to use in the "diffusion step," the present apparatus and process may also be used in "contacting steps" in which alloy electrical contacts are formed on the wafer surface. For example, when photoengraving processes are employed for depositing the contact forming material, resist removal may be effected by the processes and apparatus of the present invention. Similarly, when the contacting processes require the removal of excess metals such as aluminum, an etchant such as hosphoric acid, acetic acid or nitric acid may be used according to the present invention.

Cleaning Fluid Apparatus and Method

Part of the present invention contemplates a method and apparatus for pumping and filtering high temperature, corrosive solutions such as are used conventionally for cleaning wafer surfaces. In the preferred embodiment illustrated in FIG. 1, the system utilizes two chambers or reservoirs 1 and 2 which alternately act as receiver and pump for the movement of corrosive fluid. Nitrogen, or another gas under pressure, such as argon, compressed air, or the like, acts as a driving force for movement of the corrosive solution. Four check valves, 11, 12, 13 and 14 two associated with each of the two reservoirs, insure that the corroive fluid flows in the desired direction.

Depending on the specific wafer treatment protocol which is desired to be undertaken, the corrosive fluid may be an acid or a base. For example, in the "piranha" clean, sulfuric acid is employed. Alternatively, other acids such as nitric acid or aqua regia may be used. Further, the acid may simply be an aqueous solution of the acid, or it may be a buffered acidic solution containing both acid and a buffering agent such as the salt of a weak base. Mixtures of acids may also be used.

A hot, concentrated acid such as hot, concentrated sulfuric acid may be used as a cleaning fluid. When hot, concentrated sulfuric acid is used as a cleaning fluid it preferably has a temperature of about 80 to 150 degrees centigrade and a concentration of about 90 to 100 weight percent sulfuric acid.

In other types of wafer treatment protocol, such as the "RCA clean," a corrosive base such as ammonium hydroxide may be used. Mixtures of corrosive bases or buffered base may be used. When ammonium hydroxide is used as cleaning fluid, it preferably has a temperature of about 60 to 100 degrees centigrade and a concentration of about 30 weight percent ammonium hydroxide.

Although FIG. 1 illustrates apparatus for providing a single corrosive process fluid to the wafer vessel, a plurality of such apparatus may be provided so that a treatment protocol requiring several different corrosive fluids, such as both sulfuric acid and ammonium hydroxide, may be implemented. Further, although FIG. 1 illustrates an embodiment employing only two corrosive fluid reservoirs, a plurality of reservoirs may be employed, such as a first, second and third reservoir wherein, for example, the fluid may be pumped in succession from a first to a second reservoir, from a second to a third reservoir, and from a third to a first reservoir.

In the embodiment illustrated in FIG. 1 corrosive fluid such as acid flows from the left corrosive fluid reservoir 1 under the pressure of nitrogen (controlled by valve 201), through outlet check valve 13, and filter inlet 9, valve 21, into filter 18. Each of the corrosive fluid reservoirs has associated means for applying nitrogen or another compressed gas to the surface of the corrosive fluid contained within the reservoir by gravity.

In an alternative embodiment (not illustrated), acid circulates from supply reservoir under gas pressure to an elevated receiving reservoir, which is drained periodically to the supply reservoir by gravity.

In the illustrated embodiment band heaters 3 and 4 are provided for heating the corrosive fluid within the storage reservoirs 1 and 2. In addition, relief valves 203 and 204 are provided for venting each of the reservoirs to the atmosphere. Fluid level indicators 7 and 8 are provided for indicating the level of corrosive fluids within each of the reservoirs; and temperature sensors 5 and 6 are provided for sensing the temperature of reservoir fluid within each reservoir. Agitators for agititating the corrosive fluid within each reservoir may be provided to minimize temperature and concentration gradients. For example, a prefiltered gas such as prefiltered nitrogen or compressed air may be bubbled through the corrosive fluid within the tanks to agitate the corrosive fluid contained therein.

In each case where nitrogen, another inert gas such as argon, or another compressed gas such as compressed air, is used in the processes of the present invention, the gas is preferably filtered prior to use to remove particulate matter. Suitable processes and apparatus for filtering particles from a gas are known in the art.

In order to further minimize particle introduction into the corrosive fluid, all valves are preferably selected to minimize particle generation. For example, valves 201 and 202 controlling nitrogen introduction to the corrosive fluid reservoirs may be fail-closed, spring loaded, polytetrafluoro- ethylene-lined, steel diaphram valves or other types of valves which do not employ shearing action.

While the level indicators 7 and 8 may simply indicate that a preset level, such as a maximum and/or minimum, has been achieved, it is preferred that the level indicators be full length analog sensors capable of sensing continuously the level of corrosive fluid within the reservoirs. Full length analog sensors permit the calculation of the flow rate of fluid into or out of the corrosive fluid reservoirs Preferably, reagent grade, and more preferably, electronic reagent grade chemicals such as sulfuric acid, hydrofluoroic acid, hydrochloric acid, etc., are employed in the processes of the present invention to minimize particulate contamination.

Referring again to FIG. 1, after flowing through filter inlet valve 21 the corrosive fluid is distributed to a plurality of particulate filter cartridges 18. In the illustrated embodiment, the corrosive fluid flows from the interior of the tubes constituting the individual filter cartridges, through the walls of these tubes, to the exterior. Alternatively, the corrosive fluid may flow from the exterior to the interior of the individual tubes. While the particle filters themselves may have other geometries, such as discs, the tubular geometry is preferred. The filter cartridges themselves ar preferably constructed from bundle of tubes which are made from a porous ceramic material. Preferably, the ceramic material is a high purity alumina or other chemically inert material. Tubes which are prepared from an alumina which is sintered together to yield a highly asymmetric controlled pore structure, such as those sold by Norton Company of Worchester, Mass., under the "Ceraflo" trademark, are especially preferred. Preferably, the particle filter removes particles having an average particle size greater than about 0.2 microns ($2 \times 10^{-5}$ cm) from the cleaning fluid before the fluid contacts the wafers.

In the illustrated embodiment of FIG. 1, the filter for the corrosive fluid has a body 15 constructed from steel pipe lined with polytetrafluoroethylene and from two polytetrafluoroethylene reducing filter flanges 16 and 17. Band heaters 19 are employed to maintain the corrosive fluid within the filter at a desired temperature. After flowing through the filter elements to remove particulate matter, the filtered corrosive fluid flows through an upper fluid outlet 205. Preferably, the outlet is selected so to allow the insertion of a temperature probe into the corrosive fluid filter itself to sample the temperature within the filter. Alternatively, the temperature probe may be inserted through a separate fitting on the corrosive fluid filter.

Within the corrosive fluid filter, tube sheets made from a corrosive resistant material such as polytetrefluoroethylene are used to support the filter cartridges inside the filter housing. The bottom or inlet tube sheet is drilled in such a way so that the open end of the filter cartridges may be tightly fitted into the holes. These holes are drilled completely through the tube sheet so that incoming fluid may pass through the tube sheet and into the interior cavity of the tubular filter cartridges. For each filter cartridge, a gasket such as an "0" ring, made from vinylidene fluoride/hexafluoropropylene elastomer (sold under the "Viton" trademark by E. I. duPont de Nemours), is employed to insure that fluid cannot pass through the tube sheet to the shell side of the filter cartridges, thereby short-circuiting the filtration.

The upper end of each filter cartridge is fitted with a polytetrafluoroethylene cap which prevents fluid from escaping out of the end of the tubular cartridges. Fluid must pass through the microporous tubes in order to reach the fluid outlet. The upper or outlet tube sheet is drilled in such a fashion so as to support the capped upper end of the filter cartridges. To allow the filtered fluid to escape through the fluid outlet, the upper tube sheet is also drilled with a pattern of vent holes which allow the fluid to pass through the tube sheet and into the outlet reducing filter flange 16.

In addition to being able to withstand severe chemical and temperature conditions, another advantage of this corrosive fluid filter is is that it may be backwashed to rejuvenate its filtration capabilities. In contrast, most micron filtration cartridges currently used in the semiconductor industry are discarded after they become loaded with particulate matter.

In the corrosive fluid filter of the illustrated embodiment, backwashing of the filter is achieved simultaneously with draining used acid from the system. Just as in the normal pumping operation, gas pressure is used to forced the corrosive fluid through the filter, but in the reverse direction, and out the acid drain 20. Valves 21 and 22 are utilized to direct the flow in the reverse direction through the filter. The filter inlet valve 21 is closed and filter bypass valve 22 is opened. Additionally, the wafer vessel bypass valve 23 is closed and the wafer vessel lower three-way valve 24 is also in a position which blocks the flow of corrosive fluid. This valving arrangement insures that corrosive fluid flows out of the corrosive fluid reservoir an through the corrosive fluid filter in the reverse direction to the drain.

To replenish the system with fresh corrosive fluid a different valving configuration is employed. Corrosive fluid is pumped in through fill port 26 utilizing a conventional, airdriven, solid polytetrafluoroethylene diaphram pump. Both valves 21 and 22 are kept in a closed position to insure that fresh corrosive fluid flows up through the corrosive fluid filter and toward bypass valve 23. Both three-way valves 24 and 25 are positioned to block the flow of corrosive fluid. Bypass valve 23 is open so that fresh corrosive fluids is allowed to flow into return line 10, and through check valves 11 and 12 into reservoirs 1 and 2 respectively.

In FIG. 1 the thickened line traces the flow of corrosive fluid through the apparatus of the present invention when the corrosive fluid apparatus is functioning in a wafer treatment mode with corrosive fluid flowing from the left reservoir to the right reservoir.

In the wafer treatment mode, the corrosive fluid leaving the corrosive fluid filter is directed by the outlet 205 into line 210 to the bottom three-way inlet/outlet valve 24 associated with the wafer vessel 200. The corrosive fluid flows up past liquid level detector 29 which senses its presence, continues up past the wafers within the wafer vessel 200, and exits the wafer vessel through the vessel upper three-way inlet/outlet valve 25. This three-way valve communicates through return line 10 with return check valve 11 or 12 which opens under the pressure of the applied fluid to permit the corrosive fluid to enter a second corrosive fluid reservoir. This second reservoir is vented to the atmosphere and is consequently at a lower pressure than the supply reservoir to which pressure has been applied.

The return line 10 communicating between the valve 25 and check valve inlet 11 or 12 is preferably connected with means for ozone injection including an ozone injection valve 206. In addition, a corrosive fluid sample port may be provided including an associated corrosive fluid sample port valve 207. Apparatus for generating ozone (not shown) preferably supplies ozone for injection into the return line 10 thereby permitting ozone to be injected into the corrosive fluid.

When the corrosive fluid is an oxidizing agent such as hot sulfuric acid, the ozone functions to oxidize organic contaminants which have been removed from the wafers by the corrosive fluid and to oxidize reduced derivatives of sulfuric acid which have been produced by chemical reaction with species on the surface of the wafers treated. For example, sulfuric acid may be reduced to sulfurous acid when reacting with wafer contaminants, and the ozone will regenerate the acid by oxidizing sulfurous acid to surfuric acid. The injected ozone also tends to produce agitation of the corrosive fluid by bubbling in the reservoir thereby promoting heat transfer between the heated walls of the reservoir and the corrosive fluid contained therein. Regeneration of the corrosive fluid of ozonation allows the cleaning fluid to be used over and over for up to several weeks or more without being replaced. This not only reduces raw material expenses but also avoids waste disposal problems.

Overall, the cleaning fluid portion of the present invention provides a means for pumping and simultaneously filtering high temperature, aggressive fluids. The operating sequence of the illustrated pumping apparatus may be summarized as follows:

When the pumping system is at rest, both left and right reservoirs 1 and 2 are approximately half full. Both reservoirs are vented to the atmosphere and valves 21 and 22 are closed. Valve 23, however, is open to allow the filter to "breathe" as the corrosive fluid in the filter expands and contracts during temperature fluctations.

When pumping begins, valve 21 opens and valve 23 closes. The two three-way valves 24 and 25 are adjusted as to allow the corrosive fluid to flow as illustrated in FIG. 1. Gas pressure is introduced to one of the corrosive fluid reservoirs 1 or 2 arbitrarily selected and corrosive fluid begins to flow up through the corrosive fluid filter and the wafer vessel. Air or gas which initially is in the wafer vessel is forced out the top, through check valve 25 line 10, valve 11 or 12, and into the vented corrosive fluid reservoir. Alternatively, valve 25 can be adjusted to send air and gases out through the vent system eductor 27. However, the previously described method is preferred because it provides assurance that the corrosive fluid will stay on the corrosive fluid side of the apparatus thereby preventing any possibility of contacting corrosive fluid with other treatment fluids such as rinse water.

Corrosive fluid is pumped from one storage reservoir through the filter and through the wafer vessel to the other reservoir until the level sensors 7 and 8 indicate that the flow should be reversed. The reciprocating action of the pump continues for a predetermined period of time to allow sufficient flow of corrosive fluid past the wafers to effect the desired degree of cleaning.

The flow of corrosive fluid through the wafer vessel is terminated as follows: Valve 21 is closed to prevent any momentary backwashing of the acid filter. Valve 23 is opened permitting corrosive fluid to flow out of the bottom of the wafer vessel and through check valves 11 and 12 and into corrosive fluid reservoirs 1 and 2 rather than into the top of the corrosive fluid filter. Valve 25 is adjusted to permit compressed gas to enter the wafer vessel from a compressed gas source through valve 28. The reservoir vent valves 203 and 204 are also opened to permit compressed gas to flow and allow corrosive fluid to return to the reservoirs.

Corrosive fluid is displaced out of the wafer vessel until the level switch 29 detects that gas is present rather than liquid. At this point, valve 24 is set to block off communication line 210, and compressed gas from source 28 is simultaneously shut off. Because of the arrangement of check valves employed, when no differential pressure exists between the corrosive fluid reservoirs, corrosive fluid within the reservoirs is self-leveling.

Rinsing Fluid Apparatus and Method

The present invention also provides apparatus and processes for generating, pumping, and filtering high quality rinsing fluid used in rinsing wafers contained within the wafer vessel. Most semiconductor wet processes utilize a relatively small flow of high purity water which is "final filtered" and then utilized in a once-through fashion. In contrast, the present invention provides a high flow rate of rinsing fluid which recirculate through filters and which yields much better purity and efficiency of rinsing than prior art processes.

Achieving a high circulation flow rate is facilitated by the use of a totally enclosed process wafer vessel such as that described in copending U.S. patent applications Ser. Nos. 747,894 and 747,895, and U.S. Pat. No. 4,577,650.

The preferred rinsing fluid is water. However, depending on the nature of the surface of the wafer to be rinsed, the nature of the contamination present on the surface, and the nature of process chemicals (e.g., cleaning or etching fluids) to be rinsed, other rinsing fluids may be employed. Other rinsing fluids which may be employed include organic solvents, mixtures of organic solvents and water, mixtures of organic solvents, and the like. When selecting alternative rinsing fluids, it is important to determine whether the proposed rinsing fluid is compatible with the filtration membrane material employed and the ion exchange resin or resins employed to remove dissolved materials. It is preferred that the rinsing fluid be water which has been deionized and filtered to remove dissolved and suspended matter.

It is also preferred that the rinsing fluid contact the wafers as a single phase, such as a liquid, and be substantially free of phase boundaries, such as gas/liquid interfaces, which occur when gas bubbles are present in a liquid. Particles tend to collect at such interfaces, and they are thus undesirable.

In the preferred embodiment the rinsing fluid is water which is continuously recirculated through cationic exchange resin and anionic exchange resin prior to us in rinsing wafers. However, the nature of the ion exchange resin which effects maximum removal of dissolved ions will be determined by the characteristics of the make-up water used. Preferably, a mixed bed of cationic and anionic exchange resin is used, such as that sold by Rohm and Haas Company of Philadelphia, PA under the trademark "Amberlite" and grade designation IRN-150, or such as that sold by the Dow Chemical Company of Midland, Mich. under the trademark "Dowex" and grade designation MR-3. A mixture of a strongly acidic cationic resin and a strongly basic anionic resin, yielding high quality effluent water free of metal cations, is preferred. However, discrete beds of anionic and cationic resins such as "Amberlite" IRN-77 and IRN-78 may be used in separate tanks connected in series. Multiple tanks containing ion exchange resins beds may also be used.

Rinsing fluid used in the present invention is filtered to remove particulate matter prior to being used to rinse wafers. Filtration preferably occurs after dissolved ions have been removed by flow of the rinsing fluids through the ion exchange resin. Selection of the filtration medium to be used depends to some extent on the use to be made of the rinsed wafers. For example, when the wafers are to be used in the fabrication of very large scale integrated (VLSI) circuits, a filtration medium selected to yield a particulate-free filtrate is preferred. It is generally desirable to minimize both the quantity and average size of particulate contamination in the rinsing fluid.

In general, the filtration medium may be selected from micron filtration membranes, ultrafiltration membranes and reverse osmosis filtration membranes. Micron filtration membranes are characterized by a porous structure which facilitates retention of particles on the filter (removal from the fluid) having an average dimension of greater than about 0.2 micron ($2 \times 10^{-5}$ centimeter). Ultrafiltration membranes are characterized by pore structures which facilitate the retention of particles having an average dimension greater than about 0.006 micron ($6 \times 10^{-7}$ centimeters). Reverse osmosis filtration membranes are characterized by having a continuous rather than porous structure and by consequentially retaining particles having dimensions greater than molecular dimensions.

In the present method it is preferred that the filtration of rinse water be effected by the flow of the water through at least one ultrafiltration membrane which effectively removes particulate matter having an average particle size greater than about 0.006 microns ($6 \times 10^{-7}$ centimeters). While a single type of filtration medium, such as an ultrafiltration membrane, may be employed, a series of filters having different particulate filtration capabilities may also be used. For example, water coming from the ion exchange resin bed may first be filtered through a micron filter and then subsequently through an ultrafilter prior to use. Alternatively, the deionized water coming from the ion exchange resin bed may be prefiltered by means of an ultrafilter and subsequently filtered through a reverse osmosis membrane.

The surface area of filter required depends on the nature of the filter and on the desired flow rate of filtered rinsing fluid which is to be delivered to the wafer vessel. Because it is preferred to provide relatively high fluid velocity of rinsing fluid past the wafers in the wafer vessel, such as about 0.2 meters per second, a relatively large filter urface area is preferably employed. Large surface areas may be achieved by configuring the flow of rinsing fluid through parallel filters.

In order to prolong the effective life of the filters used, it is preferred that means be provided for backwashing the filters to dislodge and remove retained particulate matter, such that the particulate matter is discarded with the backwash fluid. Preferably, filters are backwashed periodically.

It is especially preferred that the rinsing fluid be continuously recirculated throught the filtration system when the rinsing fluid is not being supplied to the wafer vessel to rinse the wafers. Continuous circulation of the rinsing fluid through the filtration system discourages bacterial growth which results in contamination.

It is preferred that means be provided for controlling the temperature of the rinsing fluid. It is further preferred that the rinsing flow be maintained at a temperature of about 30 to 60 degrees centigrade when water is used as the rinsing fluid.

It is preferred that the wafers be rinsed until the effluent of the rinsing fluid from the wafer vessel meets predetermined quality criteria. The quality of the effluent rinsing fluid may be evaluted by measuring its electrical resistivity or conductivity to sense the concentration of dissolved ions which it contains. For example, rinsing may be continued until the effluent rinsing fluid increases in resistivity to achieve a predetermined level. It is preferred that the mininum terminal resistivity of the effluent rinsing fluid be from about 6 to 18.3 megohm-centimeter at 25 degrees centigrade.

Another quality criterion, which may be employed concurrently with the determination of the electrical resistivity or conductivity of the effluent, is the concentration of suspended particles within the effluent. Rinsing may be continued until a predetermined maximum concentration of suspended particles is achieved.

The concentration of suspended particles may be determined by an optical method, such as by measuring the intensity of scattering of applied incident light. Alternatively, an optical particle counting instrument, such as that supplied by Particle Measuring Systems Inc. of Denver, Colo., as model LIL, may be employed to count the population of particles contained within the flowing effluent rinsing fluid without disturbing the flow of the rinsing fluid. Preferably, the concentration of suspended particles is determined without disturbing the flow of the effluent so as to minimize the introduction of measurement errors associated with sampling technique. Both laser and white light optical counting instruments may be employed.

Preferably, a measurement technique which is sensitive to the average dimension of suspended particles is used. For example, the measurement technique and apparatus may sample particles which have an average major dimension within a series of predetermined ranges. This data yields the number distribution of particles as a function of particle size, which may be used in determining whether the rinsing fluid meets the target gas quality criteria. The actual density of suspended particles may be measured directly or it may be calculated from sampled particle densities.

Sampling statistics dictate whether direct measurement of particle density or a calculated density is to be used to determine whether the rinsing fluid meets preestablished particle density criteria. For example, a relatively "clean" rinsing fluid may have very few relatively large particles, but many relatively small particles. In this situation counting the small particles will require less time than counting large particles. Thus, even though the target criterion may be a maximum permissible level of large particles, counting small particles will be preferred, provided the particle size distribution is known or can be approximated.

In a preferred embodiment, rinsing is continued until the effluent rinsing fluid has a predetermined maximum density of suspended particles. Preferably, this maximum density is about 1 particle per liter of particles which have an average dimension of about $10^{-4}$ centimeters.

For use in circulating the rinsing fluid to the system, a vertical sump pump 30, which requires no seal to protect the motor from the liquid being pumped, is preferred. The preferred verticle sump pump design is one which employs a cantilever bearing design wherein the two pump shaft bearings are located directly above and below the pump motor. In this preferred design, no rubbing surfaces, such as seals and bearings, are exposed to the high purity rinsing fluid where such exposure might create particle contamination. A preferred vertical sump pump of this design is supplied by Vanton, Inc., of Hillside, N.J. as model SGH. This pump, as well as all piping and valving preferably employed in the rinsing fluid apparatus, is manufactured from virgin, unpigmented polyvinylidene difluoride.

In the preferred embodiment the demineralization vessel which contains the ion exchange resin is fabricated of virgin, unpigmented polypropylene backed with fiberglass reinforced plastic. In the preferred embodiment, the ion exchange resins are in equimolar mixture of nuclear grade cationic and anionic ion exchange resins. In the preferred embodiment, ultrafiltration modules fabricated from polysulfone are employed. End-caps and fittings for the ultrafiltration modules are fabricated from polyvinylidene difluoride so that butt-weld connections may be made to the remainder of the piping systems. Ultrafiltration modules such as those manufactured by Romicon, Inc., of Woburn, Mass., and sold as model HF-132-20-PAR-50, may be used.

In the preferred embodiment, the rinsing fluid storage tank 35 is constructed from virgin, unpigmented polyvinylidene difluoride. The return nozzle for the rinsing fluid stream is mounted tangentially to the tank so as to give some swirling action inside of the tank. This agitation helps to prevent stagnation. Additionally, it is preferred that the rinsing fluid be irradiated to avoid bacterial growth. In the preferred embodiment, the irradiation is effected by an ultraviolet lamp 36 fitted into the rinsing fluid storage tank to discourage bacterial growth. In an illustrated embodiment, three level switches 37a, 37b and 37c, are mounted on the exterior of the tank and signals from these switches are sensed to maintain the proper rinsing fluid tank level. The tank vent (not shown) is designed so that when the tank breathes out, it breathes out to the ambient atmosphere, but when the tank breathes in, it draws in purified gas under pressure, such as purified nitrogen.

It is preferred that an insertion heater 38 be mounted within the rinsing fluid storage tank 35 so that the temperature in the rinsing fluid recirculation system may be maintained precisely at its set point temperature as measured by temperature monitor 39. The temperature set point may be optimized for the characteristics of the wafer surface and the specific treatment process employed. A 50 degree centigrade set point is preferred to maximize the solvation efficiency of water while simultaneously staying comfortably below the temperature at which ion exchange resins and ultrafiltration membranes may begin to thermally degrade.

The rinsing fluid will be consumed as it is contaminated with reagents inside the wafer vessel. Thus, supplemental rinsing fluid must be added to the system. In the illustrated embodiment, fresh, deionized make-up water is introduced through a water heater 40 which has 50 kilowatt heating capacity. A temperature control loop 41 adjusts the flow rate of make-up water so that incoming water has a temperature equal to the recirculation temperature set point. Make-up water flow is completely shut off if the water tank level exceeds a maximum level as sensed by top level switch 37c. Make-up water feed is resumed when the water level within the storage tank drops below a predetermined intermediate level as sensed by middle switch 37b. It is preferred that the make-up water be of high quality in terms of adding low dissolved solids and low suspended solids in order to avoid premature exhaustion of the ion exchange resin bed and the filtration modules in the recirculating system.

High flow rate recirculation offers several advantages for semiconductor wafer wet processing. The first, and perhaps the most important, is that multiple pass filtration is facilitated. The total volume of the rinsing fluid system in the illustrated embodiment is roughly 80 gallons (300 liters) so that at a flow rate of 40 gallons per minute (2.5 liters per second) the rinsing fluid in the illustrated apparatus may be filtered once every two minutes. This high turnover rate allows achievement of purity levels far beyond those which can be reached in a once-through system.

Another advantage is that when using a wafer vessel such as one of those described in copending U.S. patent applications Ser. Nos. 612,355, 747,894 or 747,895, extraordinarily fast rinse down can be achieved. For example, if the wafer vessel is designed for 125 millimeter (5 inch) diameter wafers and the rinse flow rate is 40 gallon per minute (2.5 liters per second), then complete displacement of liquid through a vessel segment occurs every second. A typical spray dump rinser of the prior art can rinse wafers twice in about 15 seconds, whereas in the illustrated embodiment the high flow rate recirculating system can rinse wafers 15 times in the same 15 seconds. Further, where the recirculating water apparatus is used to dilute a concentrated chemical reagent, such as described hereinbelow, good heat and mass transfer are achieved. These characteristics are important for reproducible results in chemical reaction processes such as wafer etching. The turbulent, plug-flow characteristics of the recirculating apparatus allow for far superior heat and mass transfer over the conventional stagnant tank systems of the prior art.

The operation of the recirculating rinsing fluid system during a wafer rinse cycle is illustrated with reference to FIG. 1 as follows:

During corrosive fluid processing of the wafers, the rinsing fluid apparatus is in a recirculation mode wherein rinsing fluid flows up to the wafer vessel through by-pass valve 45, and back to the rinsing fluid storage tank 35. During this time the rinsing fluid is being purified through multi-pass filtration.

Prior to rinsing, the corrosive fluid is allowed to drain by gravity from the surface of the wafers after the corrosive fluid is displaced by pressurized gas as previously disclosed. After the corrosive fluid has been displaced out of the wafer vessel 200, upper three-way valve 25 and lower three-way valve 24 are adjusted to open the wafer vessel to the rinsing fluid recirculation apparatus. Valve 42 is opened and eductor 27 is turned on so that a partial vacuum is created in the wafer vessel 200 and rinsing fluid is drawn up through the vessel, through the vent valving, and into the eductor. This insures that any air or gases contained in the wafer vessel are completely expelled.

Also, during this time the eductor is supplied with rinsing fluid from the reject side of the ultrafiltration modules 32 through valve 209. This allows for periodic flushing of solids trapped on the feed side of the filtration units.

After a preset time interval, valve 43 and 44 are opened while valve means 42 is closed. At this point, a fast down flow rinse through valve 44 to a drain surge tank 208 occurs. In the line to the drain surge tank there is a resistivity sensor which monitors the quality of the rinse fluid coming out of the wafer vessel. When the measured resistivity increases to a preset point, valve 42 is opened and valve 44 is closed. At this point the rinse flow is no longer through to the drain surge tank 208, instead the rinse fluid recirculates back to the rinsing fluid tank 35. The recirculation rinse continues until the resistivity indicator 33 and the particle counter 34 detect that the purity of the rinsing fluid coming out of the wafer vessel is satisfactory.

Throughout the rinsing fluid purification and recirculation apparatus, care must be taken to avoid crevices and to use materials which are compatible with ultra high purity rinsing fluid. Whenever possible, butt-welding for piping connections is preferred. If flanges are required, expanded foam polytetrafluoroethylene material is preferably used as a gasket. Expanded foam polytetrafluoroethylene gasket material is supplied by W. L. Gore & Associates of Wilmington, Del.

In the illustrated preferred embodiment the ultra filtration modules 32 may be periodically backwashed. This may be accomplished by closing valves 43, 45 and 46 while valves 47 and 48 are open. In this manner the flow through the ultrafiltration modules is reversed so that purified rinsing fluid flows into the outlet of the ultrafiltration modules 32, through the ultrafiltration filter walls in the reverse direction, and out through the ultrafiltration module inlet, through valve 48, to the drain surge tank 208. The interval at which this periodic backwash is performed will depend on the quality of the make-up water used.

Reagent Injection Apparatus and Method

In the prediffusion cleaning of silicon surfaces, such as in the prediffusion cleaning of wafers for the manufacture of integrated circuits, the surface is often lightly etched with an etchant such as hydrofluoric acid. Batch dipping methods for performing such etching reactions are well known in the art.

The present invention also provides a process and apparatus for reacting the surface of the wafers within the wafer vessel with at least one chemical reagent and for removing the chemical reagent from the wafers with a rinsing fluid. Preferably, as in the case of corrosive fluid and rinsing fluids, the chemical reagent is introduced into the wafer vessel as a single physical phase, such as a liquid or gas, free from such discontinuities in phase as the phase boundaries which occur between liquid and gas species. For example, a chemical reagent in the form of a liquid phase containing entrained gas bubbles, or a gaseous phase containing liquid droplets, is to be avoided, especially when the gas phase includes ambient air.

The chemical reagent may be an etchant such as hydrochloric acid or hydrofluoric acid. Preferably the chemical reagent in concentrated form is diluted with the rinsing fluid to give diluted chemical reagent. It is preferred that the chemical reagent in concentrated form be metered into the rinsing fluid at a predetermined rate after completion of a rinsing step. At this point, the rinsing fluid has been deionized and filtered and is substantially free of contaminants such as residual corrosive fluid. The diluted chemical reagent subsequently contacts the wafers.

In one embodiment, it is preferred that the chemical reagent be an aqueous solution of hydrofluoric acid which has a concentration of about 0.05 to 5 percent by weight hydrofluoric acid. It is especially preferred in the same embodiment that the chemical reagent in concentrated form be an aqueous solution of hydrofluoric acid having a concentration of about 40 to 50 weight percent hydrofluoric acid and that this concentrated reagent be metered into the rinsing fluid at a rate sufficient to dilute the concentrated reagent with the rinsing fluid at a ratio of about 1:10 to 1:1000.

In another embodiment, the chemical may be an aqueous solution of hydrogen peroxide which has a concentation of about 0.05 to 5 percent by weight hydrogen peroxide. It is preferred in the same embodiment that the chemical reagent have a concentration of about 30 percent hydrogen peroxide and that this chemical reagent in concentrated form be metered into the rinsing fluid at a ratio of about 1:5 to 1:500.

It is preferred that the concentrated chemical reagent be injected into the rinsing fluid by valve means through which the chemical reagent may be continuously recirculated when not being metered into the rinsing fluid. A suitable valve is available from Mace Corp., of S. El Monte, Calif. as series 803. This five port, four way valve permits both recirculating chemical reagent and rinsing fluid to flow through the valve without mixing in one valve position, while in another position the flow of rinsing fluid into the valve is blocked and the chemical reagent inlet is connected to the outlet to the rinsing fluid stream.

It is also preferred that the concentrated chemical reagent be filtered through a filtration membrane prior to injection into the rinsing fluid. When the concentrated chemical reagent is not being injected into the rinsing fluid, but rather is being continuously recirculated, the concentrated chemical reagent is simultaneously being continuously filtered through the filtration membrane. The flow of the concentrated chemical reagent is preferrably effected by a metering pump such as that by Pulsafeeder of Rochester, N.Y., model no. 680. The filtration membrane employed to continuously filter the concentrated chemical reagent is prefrably a polypropylene membrane filter having a nominal pore size of 0.2 microns ($2 \times 10^{-5}$ centimeter) such as that manufactured by Gelman of Ann Arbor, Mich., and sold under the "Polypure" trademark as model no. TDC.

Subsequent to completing injection of the concentrated reagent, it is preferred that a portion of the flow of the rinsing fluid be directed to flow through the injection valve means to rinse the valve means and to rinse associated lines ines w whereby the injection of the concentrated reagent may be abruptly terminated. A portion of the rinsing fluid is preferably diverted from the principal flow path to the path passing through the injection valve by means of an orifice plate.

The process employing the chemical reagent injection apparatus of the present invention may be illustrated with reference to the preferred embodiment of FIG. 1. A preferred injection system consists of a concentrated reagent reservoir 49, preferably containing a 50% by weight solution of hydrofluoric acid, a precision metering pump 50, a micron filter 51, and a five-port, four-way valve 52. The purpose of this apparatus is to inject an exact amount of solution into the flowing high purity rinsing fluid stream for a precisely controlled period of time. Prior to injection, pump 50 draws concentrated reagent out of reservoir 49, through filter 51, and through valve 52, back into reservoir 49. This preinjection recirculation allows for the metering pump to achieve a very precise flow rate. Transients in the system associated with beginning to pump are given time to level out. Simultaneously, the rinse fluid flow rate and rinsing fluid temperature are adjusted via flow control valve 46 and heater 38 to achieve precisely controlled conditions. Simultaneously, water bypass valve 45 is closed to permit precise flow of the rinsing fluid to give precise dilution of the concentrated reagent.

When all conditions monitored indicate that predetermined injection criteria are met, valve 52 switches so that concentrated reagent is injected into the flowing rinsing fluid line rather than being recirculated back to the reservoir. A static mixer insures that the injected concentrated reagent is mixed well with the flowing rinsing fluid. In this manner, a precise and reproducible concentration of diluted chemical reagent can be pumped through the wafer vessel. Normally, valve 44 will be opened and valve 42 will be closed so that the dilute reagent is sent to the drain surge tank 208 rather than being recycled back to the rinsing fluid reservoir.

After the preset injection time interval has elaspsed, valve 52 is turned back to the recycle position. When this occurs rinsing fluid is allowed to flow through the fiveport, four-way valve of the preferred embodiment. This rinsing fluid flow through the valve sweep the residual chemical reagent out of the valve to insure a very prompt and clean termination of the injection step.

An orifice plate 53 provides an incentive for the rinsing fluid to flow through valve 52 and back into the flowing rinsing fluid line.

Alternatively the four-way valve may be replaced with a pair of three-way valves. In this embodiment one of the threeway valves forms an element of the concentrated reagent recirculation loop such that one port of the valve is connected to the particle filter 51 outlet and another port is connected to the return to the concentrated reagent reservoir 49. These ports are connected in the recirculation mode. The third port of the first valve is connected to an inlet port of the second valve. One of the other two ports of the second valve is connected to an inlet rinsing fluid line upstream of the orifice plate 54 and the third port of the second valve is connected to an outlet line returning to the rinsing fluid line downstream of the orifice plate 54.

In the injection mode, the first valve is adjusted so that the inlet port from the particle filter 51 is connected to the outlet port of the first valve to the second valve and the second valve inlet port is open to receive from the first valve the flow of concentrated reagent pumped by pump 50. The second valve is adjusted to direct the flow of concentrated reagent to the outlet return line downstream of the orifice plate 54. Other valving arrangements will be readily apparent to those skilled in the art.

In the preferred embodiment, the entire concentrated reagent injection apparatus is constructed of virgin polytetrafluoroethylene and copolymers of tetrafluoroethylene and fluorinated vinyl ether to insure high resistance against corrosion.

It is preferred that immediately prior to contacting the surface of the wafers within the wafer vessel, the diluted chemical reagent be passed through a helical flow director to promote turbulent, plug flow and to substantially avoid channel flow of the chemical reagent past the wafers. While a helical flow diverter such as disclosed in U.S. patent application Ser. No. 747,894 now U.S. Pat. No. 4,633,893 is preferred other types of flow directors which impart angular momentum to the diluted reagent solution and which are used in connection with apparatus which increases the crosssectional area transverse to the fluid flow prior to contacting the wafers, such as disclosed in U.S. patent application Ser. No. 747,894, may also be used. Other flow imparting structures which permit uniform displacement of rinsing fluid with chemical reagent a the initiation of the chemical reagent injection step and uniform displacement of the diluted reagent with rinsing fluid at the termination of that step, may also be used.

After a chemical reagent reaction step has been terminated, the rinsing fluid recirculation apparatus goes back into a rinse mode. Referring again to FIG. 1, rinsing fluid flows through the wafer vessel 200 in the downward direction to the drain surge tank until the measured resistivity reaches a preset level. At that point, the rinsing fluid returns to full recirculation until resistivity sensor 33 and particle analyzer 34 indicate that the quality of rinsing fluid coming out of the wafer vessel meets predetermined criteria. At this point, the wafer vessel 200 is purged of rinsed fluid by opening gas inlet 28 and closing valve 43. Rinsing fluid is pushed out of the system until level indicating switch 29 detects that no liquid remains in the vessel. At this point valve 42 closes and the rinsing fluid system is now on full bypass.

In addition to its use in delivering precisely metered amounts of etchants to the rinsing fluid stream for use in etching or "polishing" the surface of the wafers, the above apparatus of the present invention may be employed to inject other chemical reagents precisely into the rinsing fluid stream for reaction with the surface of the wafers. For example, the same apparatus, or an additional apparatus of the same description, may be employed to inject concentrated hydrochloric acid into the rinse fluid, thereby permitting a precisely controlled wash of the surface of the wafers with dilute hydrochloric acid. For example, the chemical reagent in concentrated form may be an aqueous solution of hydrochloric acid having a concentration from about 10 to 40 weight percent hydrochloric acid and this concentrated reagent may be metered into the rinsing fluid at a rate sufficient to dilute the concentrated reagent with the rinsing fluid at a ratio of about 1:5 to 1:500. Such a hydrochloric acid wash step is favored in some techniques of preparing silicon wafers for diffusion.

Wafer Drying Apparatus and Methods

Conventionally, semiconductors are dried through centrifugal force in a spin rinser-drier. Because these devices rely on centrifugal force, their use results in several problems. First, there are mechanical stresses placed on the wafers which may result in wafer breakage. Second, because there are many moving parts inside a spin-rinser-drier, contamination control becomes a difficult problem. Third, since the wafers conventionally travel at high velocity through dry nitrogen, static electric charges develop on the wafer surfaces. Since oppositely charged airborne particles are quickly drawn to the wafer surfaces when the spin-rinser-drier is open, particle contamination results. Fourth, it is difficult to avoid evaporation of water from the surfaces of the wafers during the spin process. Because even short periods of contact of ultrahigh purity water with wafer surfaces will permit the water to dissolve minute quantities of silicon or silicon dioxide, evaporation of water containing dissolved silicon (deposited silicon or silicon dioxide) or silicon dioxide will result in a streak or spot on the wafer surface. Streaking or spotting often ultimately results in device failure.

The drying fluid of the present invention is preferably superheated steam, which may be generated as illustrated in FIG. 1. Water from the rinsing fluid recirculation apparatus may be used to partially fill stainless steel pressure vessel 160. The water is continuously recirculated by pump 163 through particle filter 164 when not in a drying mode. Prior to initiating a drying step, valves 162 and 165 are closed and heat is applied to the vessel 160 by means of band heaters 161. Temperature sensor 167 and pressure sensor 166 monitor the temperature and pressure of the contents of the pressure vessel 160. Valve 168 and needle valve 169 are opened, and valve 170 is adjusted to permit steam to ente vent condenser 171. Needle valve 169 is adjusted to permit saturated steam from pressure tank 160 to expand adiabatically to yield superheated, unsaturated steam. To begin drying the wafers inside the wafer vessel 200, valve 170 is adjusted to direct the steam toward valve 172, which is opened, as is valve 175. Valve 43 is closed and valves 62 and 25 are adjusted to permit steam to flow into the wafer vessel to displace rinsing fluid from the wafer vessel through lower three-way valve 24. When the rinsing fluid has been displaced, the flow of the superheated steam past the wafers is continued to heat the wafers and volatilize residual rinsing fluid.

Alternatively, superheated steam may be prepared by heating saturated steam, as is well know in the art.

Steam exiting the wafer vessel 200 through three-way valve 24 may be directed to a vent condenser (not shown) and the condensate may be discarded.

The steam may be mixed with a carrier gas such as nitrogen, argon or compressed air. Dilution with the carrier gas may be initiated at the same time the steam is first admitted into the wafer vessel 200, or subsequently. The flow of carrier gas may continue after the flow of steam has been terminated.

Preferably, the drying fluid is substantially nonreactive with the wafer surfaces.

The process of the present invention may alternatively use "chemical drying" rather than mechancial or steam drying. "Chemical drying" occurs in two steps. First, the rinsing fluid, preferably water, is driven off the wafers and replaced by a nonaqueous drying fluid. Second, the nonaqueous drying fluid is evaporated using a predried gas, preferably an inert gas such as nitrogen, at low flow velocity.

In one embodiment, the nonaqueous drying fluid is recirculated by condensing it after it has been evaporated from the wafer surfaces and by collecting the condensed drying fluid. In this embodiment it is preferred that a nonaqueous fluid which does not form an azeotrope with water, such as methanol, be employed. This permits relatively facile separation of drying fluid from residual rinsing fluid, such as water.

On the other hand, recycling of a non-aqueous drying fluid is not always necessary or desirable, as for example, when relatively small quantities of drying fluid are employed. In this case, it is preferred that a non-aqueous drying fluid which forms an azeotrope with the rinsing fluid, such as isopropanol does with water, be used. Although use of azeotrope-forming drying fluid makes recovery of the effluent drying fluid and its purification prior to recirculation difficult, use of an azeotrope-forming drying fluid insures that rinsing fluid is completely removed from the surface of the wafers prior to final evaporation of the drying fluid. The lower boiling azeotrope will volatilize from the surface of the wafers before the higher boiling drying fluid. However, when a substantial excess of drying fluid over rinsing fluid is present on the wafers' surfaces, all rinsing fluid will volatilize as the azeotrope prior to evaporation of the residual drying fluid.

When the rinsing fluid is water and a drying fluid such as methanol, which does not form an azeotrope with water, is used, the drying fluid may completely evaporate before the higher boiling water fully evaporates, an undesired result.

Preferably, the nonaqueous drying fluid is heated to form a vapor which enters the wafer tank and condenses on the interior surfaces, including the surface of the wafers to be dried. The condensed vapor displaces liquid rinsing fluid from the surface of the wafers. The transfer of drying fluid from a drying fluid liquid source to the interior of the wafer tank as a gas is preferred, as this technique reduces the amount of drying fluid which must be used to displace rinsing fluid from the wafer surfaces. Because the drying fluid may be an organic compound, such as isopropanol or methanol, which presents disposal problems, it if preferred to minimize the quantity of drying fluid employed in the process of the present invention.

Any fluid which is miscible with the rinsing fluid and non-reactive with the surface of the wafers may be used as a drying fluid. However, it is desirable that the drying fluid have a relatively low boiling point. The drying fluid may be selected from organic compounds having a boiling point of less than about 140 degrees centigrade at atmospheric pressure. Examples of drying fluids which may be employed are steam, methanol, ethanol, 1-propanol, isopropanol, n-butanol, secbutanol, tert-butanol, tert-amyl alcohol, acetone, acetonitrile, hexafluoroacetone, nitromethane, acetic acid, propionic acid, ethylene glycol mono-methyl ether, difluoroethane, isopropyl acetate, 1,1,2-trichloro-1,2,2-trifluoroethane, 1,2-dichloroethane, trichloroethane, perfluoro-2-butyltetrahydrofuran, perfluoro-1,4-dimethylcyclohexane and mixtures thereof. It is especially preferred that the drying fluids be an alcohol selected from isopropanol, methanol, 1-propanol, tertbutanol and mixtures thereof. As indicated above, in one embodiment it is preferred that the alcohol be methanol and in another that it be isopropanol.

Figure 2:
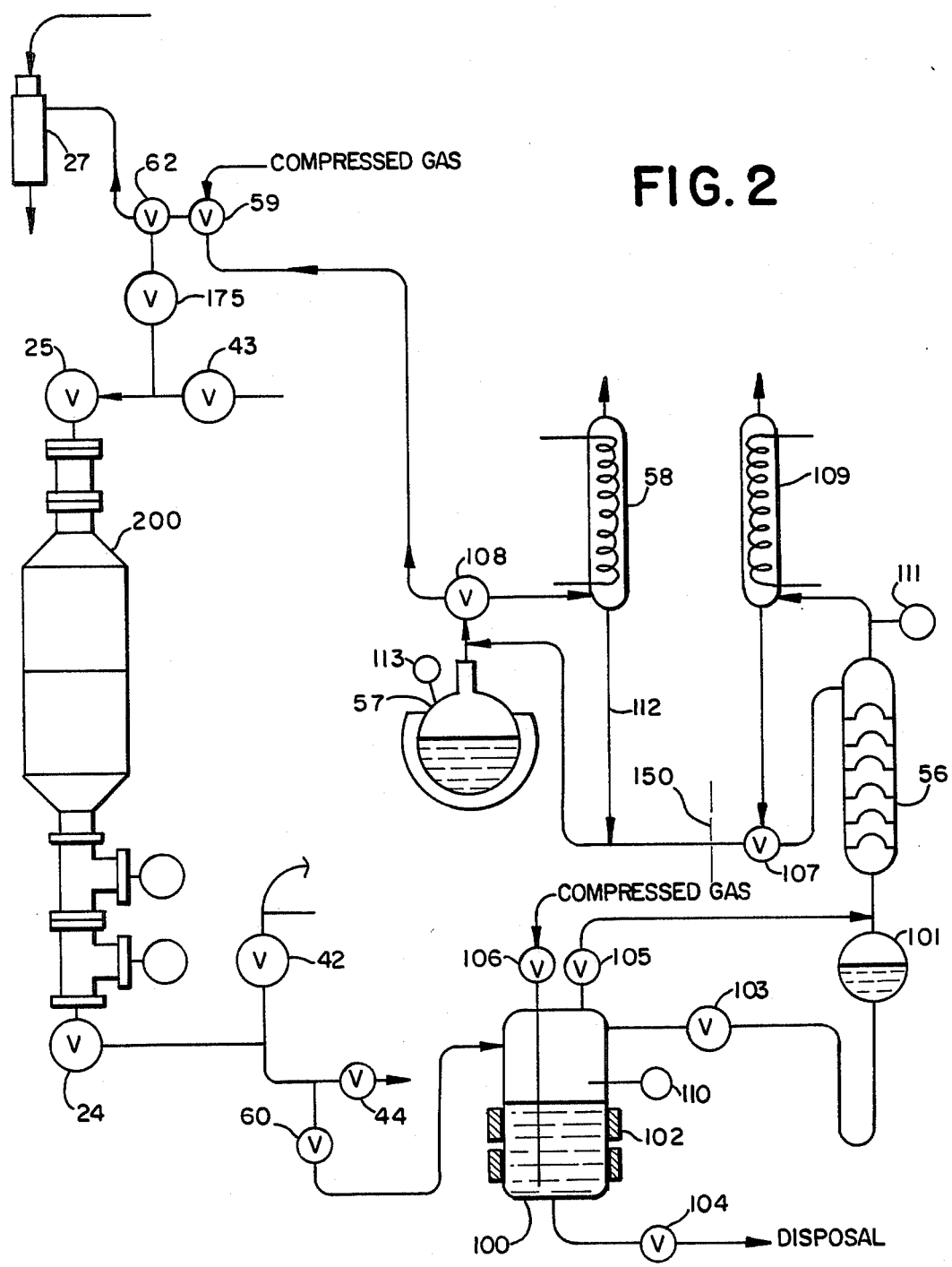
FIG. 2 illustrates an alternative embodiment of the drying portion of the apparatus which either may be used when alcohol is to be recovered from the effluent from the wafer processing stream or when effluent alcohol is merely to be concentrated prior to being discarded.

One embodiment of apparatus which may be used to generate nonaqueous drying fluid vapor and especially alcohol vapor is illustrated in FIG. 2. In many aspects the illustrated alcohol drying apparatus functions as does a conventional distillation column. A major difference is that the condenser normally associated with a distillation column is replaced in the illustrated apparatus by the wafer vessel.

Prior to initiating the drying step, the drying fluid apparatus of FIG. 2 is put into a full reflux mode by adjusting three-way valve 108 to connect the flask 57 with the vent condenser 58. Flask 57 is heated while condenser 58 is cooled.

Drying of the wafers is initiated when valve 108 is adjusted to disconnect the vent condenser 58 and connect the wafer vessel to the flask 57. Valves 25, 59, and 62 are opened in such a way so as to allow alcohol vapor to enter into the top of the wafer vessel and condensed liquids to flow out the bottom. Drying fluid condenses on the wafers and wafer vessel interior surfaces because they are cooler from the prior rinsing step which was preferably carried out with approximately 50 degree centigrade water. This flow pattern is continued for a preset period of time until nearly all of the rinsing fluid is displaced out of the wafer vessel.

At this point, valve 59 is adjusted so that a pressurized gas, such as dry nitrogen, is allowed to enter into the top of the wafer vessel, thereby evaporating the drying fluid contained in the wafer vessel. The pressurized gas is preheated prior to entering the wafer vessel to increase the rate of drying. Nitrogen laden with drying fluid passes out the bottom of the wafer vessel through valves 24 and 60, tank 100, and valve 105, and into the bubble-cap column 56 where the drying fluid is condensed while nitrogen is allowed to pass out the vent condenser 109. Column 56 is a bubble-cap distillation column which promotes contact of vapor flowing up the column with liquid flowing down the column. The column 56 is constructed in such a way so that it does not "weep," that is, liquid does not drain from the caps when the heating flask 57 is cooled. Thus, the column 56 exhibits high "hold-up." This flow pattern continues, again for a preset period of time, until all of the drying fluid has been purged from the water vessel.

In this embodiment, the drying apparatus is totally closed to the drying fluid. That is, little or no drying fluid is allowed to escape from the apparatus. However, rinsing fluid such as water does accumulate in flask 101.

In this embodiment, flask 57 is a storage flask for a drying fluid such as a methanol, which has been separated from water. A mixture of effluent water and methanol from the wafer vessel is stored in enclosed tank 100. Methanol may be stripped from the effluent water/methanol mixture as necessary at any time when wafers are not being dried, for example, during other processing steps. To strip methanol from water, valve 60 is closed and storage tank 100 is heated by application of heat through band heaters 102. Nitrogen or another gas is admitted through valve 106 and sparged through an inlet tube. The temperature of the fluid within the tank is monitored by probe 110. Valve 105 is opened to permit methanol vapor to enter the bubble-cap condenser 56. Condenser 109 is cooled and prevents methanol from leaving the system. Three-way valve 107 is adjusted to connect the vent condenser fluid return with the top fluid inlet of the bubble-cap column 56. Temperature probe 111 senses the temperature of fluid at the top of the bubble cap column to insure water vapor does not pass through the column. Valve 103 is closed and concentrated methanol/water mixture accumulates in recovery pot 101.

After substantially all the methanol has been stripped from the recovery tank 100, as determined by an increase in the temperature of the fluid contained therein sensed by means of temperature sensor 110, heat application to the recovery tank is terminated. Subsequently, valve 105 is closed and valve 104 is opened thereby permitting the pressure of gas above the residual stripped water to expel the stripped water from the recovery tank through valve 104 to an effluent drain. After the residual water has been expelled, valve 106 may be closed and valves 103 and 105 are opened to permit the concentrated alcohol/water mixture to drain into the recovery tank. The concentrated alcohol/water mixture may then be heated within the recovery tank and the sparging of gas through valve 106 may be resumed. However, valve 107 is now adjusted to permit alcohol condensing in vent condenser 109 to drain into purified alcohol storage flask 57.

When purified alcohol has been displaced from the recovery tank 100 to the storage flask 57, three-way valve 107 is adjusted to disconnect the alcohol flow path between the vent condenser 109 and the storage flask 57. Heating of alcohol storage tank 100 is terminated and the heating of purified alcohol storage flask 57 is begun with valve 108 connecting the storage flask 57 with vent condenser 58. Seal leg 112 connects the drain of vent column 58 with the inlet to alcohol flask 57 thereby preventing wrong-way flow of fluid from the storage flask back to the bubble-cap through valve 107. Alcohol is recirculated by evaporation from flask 57 and condensation in vent condenser 58.

In addition, liquid alcohol may be withdrawn from flask 57 by a pump and the withdrawn alcohol may be filtered through a filter, such as a microporous filter (not illustrated), and thereafter subsequently returned to flask 57. It may be desired to employ this filtration continuously to diminish the particulate contamination of the alcohol drying fluid.

In a third embodiment, also illustrated in FIG. 2, the drying fluid is not recycled, but is still stripped from residual rinsing fluids and recovered for separate disposal. In this embodiment the fluid connection line is broken at 150 (as illustrated in FIG. 2). Thus, vent condenser 109 may drain only into the bubble-cap condenser 56 and valve 57 may be eliminated. Similarly, vent condenser 58 drains into flask 57. Drying fluid, such as isopropanol, may be introduced directly into storage flask 57. Alcohol is stripped from the effluent alcohol/water mixture as previously described. However, the concentrated alcohol/water mixture is simply discarded after the alcohol stripping step, rather than being used as feed for the alcohol purification step as in the prior embodiment.

The processes and apparatus of the present invention are especially useful in the prediffusion cleaning of wafers, and generally, in cleaning the wafers' surface prior to modification or treatment at high temperatures, and especially prior to diffusion, epitaxial growth, and chemical vapor deposition. The present invention may be used to clean wafer surfaces prior to a variety of techniques employed to modify the surface structure and characteristics of semiconductor materials, including surface modification and surface layer growth techniques by such means as molecular beam epitaxy, photodeposition, plasma etching, ion implantation, vacuum metallization and like processes.

The present invention may also be employed in other types of wet processing of semiconductor wafers. The invention may be used in wet processing generally, such as in photoresist primer application, photoresist developing, post-development rinsing, wet etching, and photoresist stripping. For example, in etching semiconductor wafer surfaces, etchants such as hydrogen fluoride, and hydrogen fluoride buffered with ammonium fluoride, may be used to etch silicon dioxide; phosphoric, nitric, or acetic acid may be used to etch aluminum; phosphoric acid may be used to etch silicon nitride, etc.

The capability of exposing the surface of the wafers to a precisely controlled concentration chemical reagent for a precisely determined period of time indicates that the present invention may be useful in a variety of wet processing techniques which may now be developed in analogy with current dry processing and plasma, vacuum, or gas phase processing techniques.

While the body of the wafers which may be processed with the present invention is typically silicon, gallium arsenide and other wafer substrates may be used. Thus, the body may be a semiconductor, a semi-insulator, a semiresistor or an insulator. The wafer surface may be any surface which is employed in the semiconductor manufacturing art. For example, areas of the surface may be single crystal silicon, polycrystalline silicon, amorphous silicon, or silicon dioxide. The silicon and/or silicon dioxide surface may be either undoped, or doped with impurity atoms or ions, such as boron, phosphorous, arsenic et al., as is well known in the art. Similarly, the surface may contain areas of aluminum, gold or other metals.

It will be recognized by those skilled in the art that changes may be made to the above described embodiments of the invention without departing from the broad inventive concepts thereof. It is understood, therefor, that this invention is not limited to the particular embodiments disclosed, but is intended to cover all modifications which are within the scope and spirit of the invention as defined by the appended claims.

We claim:

1. An enclosed, full flow method for the cleaning of semiconductor wafers comprising positioning said wafers in a vessel, closing said vessel to the environment, and flowing process fluids sequentially and continuously past said wafers in said vessel, including the steps of
   (a) contacting said wafers with at least one cleaning fluid to remove contaminants from said wafers;
   (b) removing said cleaning fluid from said wafers with a rinsing fluid; and
   (c) removing said rinsing fluid from said wafers with a drying fluid;
      whereby the processing does not requirement movement or operator handling of said wafers between said steps; and
      maintaining the vessel containing said wafers hydraulically full during each process step.

2. A process according to claim 1 wherein process fluids are in continuous flow so that when any process fluid is not being used to contact said wafers, said non-contacting process fluid is continuously recirculated, such that the recirculation fluid flow paths do not include said vessel containing said wafers.

3. A process according to claim 1 wherein process fluids contact said wafers as a single fluid phase substantially free of phase boundaries.

4. A method according to claim 1 comprising the additional steps of
   (d) reacting the surface of said wafers with at least one chemical reagent and
   (e) removing said chemical reagent from said wafers with a rinsing fluid.

5. A method according to claim 4 wherein said chemical reagent is followed by said rinsing fluid without an intervening fluid contacting said wafers.

6. A method according to claim 4 wherein said additional steps follow rinsing said cleaning fluid and precede removing said rinsing fluid with said drying fluid.

7. A method according to claim 1 wheren said wafers comprise a body selected from silicon and gallium arsenide.

8. A method according to claim 1 wherein said cleaning fluid comprises at least one acid selected from the group consisting of sulfuric acid and nitric acid.

9. A method according to claim 8 wherein said cleaning fluid additionally comprises an oxidizing agent selected from ozone and hydrogen peroxide.

10. A method according to claim 9 wherein said oxidizng agent is ozone and is injected into said acid as a gas whereby said gaseous ozone agitates said acid.

11. A method according to claim 8 wherein said acid is a hot, concentrated acid.

12. A method according to claim 1 wherein said cleaning fluid comprises at least one base.

13. A method according to claim 12 wherein said base is ammonium hydroxide.

14. A method according to claim 1 wherein said cleaning fluid is prefiltered through a particle filter which effectively removes particles having an average particle size greater than about 0.2 microns prior to contacting said wafers.

15. A method according to claim 1 wherein said cleaning fluid is recycled through said particle filter.

16. A method according to claim 15 wherein said particle filter is periodically backwashed to rejuvenate the filtration capability of said particle filter.

17. A process according to claim 1 wherein the flow of said cleaning fluid is effected by application of pressure to a surface of said cleaning fluid in a first storage reservoir, and said pressure effects the flow of cleaning fluid from said first storage reservoir, through a particle filter, into contact with said wafers, and subsequently to a second storage reservoir.

18. The process of claim 17 wherein the flow of fluid from first to second resevoir is reversed, wherein the direction of fluid flow through said particle filter and past said wafers is maintained.

19. A method according to claim 17 wherein said pressure application is effected by gas under pressure and said gas is a gas selected from nitrogen, argon, and compressed air.

20. A method according to claim 1 wherein said rinsing fluid is water.

21. A method according to claim 20 wherein said rinsing fluid is water which has been deionized and filtered to remove dissolved and suspended matter.

22. A method according to claim 21 wherein said water is continuously recirculated through cationic ion exchange resin and anionic ion exchange resin prior to use in rinsing wafers.

23. A method according to claim 22 wherein said water is continuously recirculated through at least one filtration membrane prior to use in rinsing wafers.

24. A method according to claim 23 wherein said filtration membrane is selected from micron filtration membranes, ultrafiltration membranes and reverse osmosis filtration membranes.

25. A method according to claim 20 wherein said water is irradiated and circulated to avoid bacterial growth.

26. A method according to claim 25 wherein the circulation of said water is by means of a vertical immersion pump.

27. A method according to claim 15 wherein filtration is effected by flow of said water through at least one filtration membrane which effectively removes particulate matter having an average particle size greater than 0.2 microns.

28. A method according to claim 23 wherein said filtration membrane is regenerated by periodically backwashing.

29. A method according to claim 1 wherein said wafers are rinsed at a fluid velocity of about 0.01 to 0.2 meters per second.

30. A method according to claim 1 where the effluent of said rinsing fluid is evaluated by measuring the electrical resistivity to sense the concentration of dissolved ions as a measure of fluid quality and the rinsing endpoint.

31. A method according to claim 1 wherein the effluent of said rinsing fluid is evaluated by measuring the population density of suspended particles as a measure of fluid quality and the rinsing endpoint.

32. A method according to claim 1 wherein said cleaning fluid is displaced by pressurized gas prior to rinsing step (b).

33. A method according to claim 32 wherein said cleaning fluid is allowed to drain by gravity from the surface of said wafers prior to said rinsing step (b).

34. A method according to claim 4 wherein said chemical reagent is an etchant.

35. A method according to claim 34 wherein said etchant is an aqueous solution of hydrofluoric acid.

36. A method according to claim 5 wherein said chemical reagent in concentrated form is diluted with said rinsing fluid to give diluted chemical reagent.

37. A method according to claim 36 wherein said chemical reagent in concentrated form is metered into said rinsing fluid at a predetermined rate after completion of rinsing step (b), wherein said rinsing fluid is deionized and filtered to give diluted chemical reagent which subsequently contacts said wafers.

38. A method according to claim 37 wherein said concentrated chemical reagent is injected into said rinsing fluid by valve means through which said chemial reagent is continuously recirculated when not being metered into said rinsing fluid.

39. The method of claim 38 wherein said valve has at least two flow paths within the body of said valve means such that while said chemical reagent is continuously recirculated through one of said flow paths rinsing fluid circulates through another of said flow paths.

40. A method according to claim 36 wherein said concentrated chemical reagent and said rinsing fluid are mixed by means of a static mixer prior to said chemical reagent contacting said wafers.

41. A method according to claim 38 wherein subsequent to completing injection of said concentrated reagent, a portion of the flow of said rinsing fluid is directed to flow through said valve means to rinse said valve means and to rinse associated fluid communication means, whereby the injection of concentrated reagent may be abruptly terminated.

42. A method according to claim 41 whereby said rinsing fluid is diverted by means of an orifice plate.

43. A method according to claim 1 wherein said drying fluid is miscible with said rinsing fluid and substantially nonreactive with the surface of said wafers.

44. A method according to claim 1 wherein said drying fluid is selected from organic compounds having a boiling point of less than about 140 degrees centigrade at atmospheric pressure.

45. A method according to claim 43 wherein said drying fluid is superheated steam.

46. A method according to claim 45 herein said super heated steam is diluted with a carrier gas selected from nitrogen, argon and dry air.

47. A method according to claim 44 wherien said drying fluid is an alcohol selected from isopropanol, methanol, 1-propanol, tert-butanol and mixtures thereof.

48. A method according to claim 47 wherein rinsed wafers are contacted with a stream of alcohol vapor as said rinsing fluid is displaced by said alcohol vapor.

49. A method according to claim 47 wherein said wafers have a temperature lower than said alcohol vapor and liquid alcohol consequently condenses on said wafers.

50. A method according to claim 48 wherein alcohol is evaporated from said wafers after said alcohol has substantially replaced the rinsing fluid on said wafers.

51. A method according to claim 50 wherein the evaporation of said alcohol is assisted by a stream of gas flowing past said wafers.

52. A method according to claim 51 wherein said alcohol and residual rinsing fluid are collected as an effluent from the vessel containing said wafers.

53. A method according to claim 52 wherein effluent alcohol is stripped from effluent water by passing a gas through effluent water/alcohol mixture.

54. An enclosed, full flow method for the treatment of semiconductor wafers comprising positioning said wafers in a vessel, closing said vessel to the environment, and flowing process fluids in sequential steps continuously past said wafers in said vessel, including the step of exposing the surface of said wafers to at least one cleaning fluid, whereby the processing does not require movement or handling of said wafers between said steps.

55. An enclosed, full flow method for the treatment of semiconductor wafers comprising positioning said wafers in a vessel, closing said vessel to the environment, and flowing process fluids in sequential steps continuously past said wafers in said vessel, including the step of reacting the surface of said wafers with at least one chemical reagent, whereby the processing does not require movement or handling of said wafers between said steps and maintaining the vessel containing said wafers hydraulically full during each process step.

56. A method according to claim 55 including the additional step of removing said chemical reagent with a rinsing fluid.

57. An enclosed, full flow method for the cleaning of semiconductor wafers comprising positioning said wafers in a vessel, closing said vessel to the environment, and flowing process fluids in sequential steps continuously past said wafers in said vessel, including the step of rinsing the surface of said wafers with at least one rinsing fluid whereby the processing does not require movement or handling of said wafers between process steps and maintaining said vessel containing said wafers hydraulically full during each process step.

58. An enclosed, full flow method for the treatment of semiconductor wafers comprising positioning said wafers in a vessel, closing said vessel to the environment, and flowing process fluids in sequential steps continuously past said wafers in said vessel, including the step of rinsing the surface of said wafers with at least one rinsing fluid and subsequently removing said rinsing fluid with a drying fluid whereby the processing does not require movement or handling of said wafers between process steps and maintaining the vessel containing said wafers is hydraulically full during each process step.

* * * * *

UNITED STATES PATENT AND TRADEMARK OFFICE
CERTIFICATE OF CORRECTION

PATENT NO. : 4,778,532
DATED : October 18, 1988
INVENTOR(S) : McConnell *et al.*

It is certified that error appears in the above-identified patent and that said Letters Patent is hereby corrected as shown below:

The cover page, immediately under Related U.S. Application Data, should read:
[63] Continuation-in-part of Ser. No. 747,894, Jun. 24, 1985, Pat. No. 4,633,893, which is a continuation-in-part of Ser. No. 612,355, May 21, 1984, Pat. No. 4,577,650.

Col. 1, line 10, delete "abandoned" and insert therefor --U.S. Patent No. 4,633,893--;
col. 1, line 12, delete "now abandoned" and insert therefor --for--;
col. 1, line 13, after "Fluids,"" insert --now U.S. Patent No. 4,577,650,--;
col. 1, line 15, delete "now abandoned" and insert therefor --for--;
col. 1, line 16, delete "Fluids."" and insert therefor --Fluids," now U.S. Patent No. 4,738,272.--;
col. 1, lines 16 and 17, delete "co-pending applications" and insert therefor --patents--; and
col. 1, line 33, delete "proces" and insert therefor --process--.
Col. 2, line 32, delete "know" and insert therefor --known--; and
col. 2, line 57, delete "mechanial" and insert therefor --mechanical--.
Col. 4, line 14, delete "a" and insert therefor --an--.
Col. 5, line 15, delete second occurrence of "that".
Col. 6, line 13, delete "hosphoric" and insert therefor --phosphoric--;
col. 6, line 28, delete "corroive" and insert therefor --corrosive--; and
col. 6, line 48, delete "base" and insert therefor --bases--.
Col. 7, line 17, delete "agititat" and insert therefor --agitat--;
col. 7, line 35, delete "polytetrafluoro-ethylene-lined" and insert therefor --polytetrafluoroethylene-lined--;
col. 7, line 35, delete "diaphram" and insert therefor --diaphragm--;
col. 7, line 48, delete "hydrofluoroic" and insert therefor --hydrofluoric--;
col. 7, line 61, delete "ar" and insert therefor --are--; and
col. 7, line 62, insert --a-- between "from" and "bundle".

UNITED STATES PATENT AND TRADEMARK OFFICE
CERTIFICATE OF CORRECTION

PATENT NO. : 4,778,532
DATED : October 18, 1988
INVENTOR(S) : McConnell *et al.*

It is certified that error appears in the above-identified patent and that said Letters Patent is hereby corrected as shown below:

Col. 8, line 21 delete "polytetre-" and insert therefor --polytetra---;
col. 8, line 32, delete "duPont" and insert therefor --du Pont--; and
col. 8, line 49, delete second occurrence of "is".
Col. 9, line 5, delete "phram" and insert therefor --phragm--; and
col. 9, line 51, delete "surfuric" and insert therefor --sulfuric--.
Col. 10, line 4, delete "fluctations" and insert therefor --fluctuations--; and
col. 10, line 59, delete "recirculate" and insert therefor --recirculates--.
Col. 11, line 22, delete "us" and insert therefor --use--.
Col. 12, line 23, delete "urface" and insert therefor --surface--;
col. 12, line 33, delete "throught" and insert therefor --through--;
col. 12, line 46, delete "evaluted" and insert therefor --evaluated--; and
col. 12, line 51, delete "mininum" and insert therefor --minimum--.
Col. 13, line 38, delete "verticle" and insert therefor --vertical--; and
col. 13, line 39, delete "employes" and insert therefor --employs--.
Col. 15, line 37, delete "valve" and insert therefor --valves--.
Col. 16, line 51, delete "concentation" and insert therefor --concentration--.
Col. 17, line 9, delete "preferrably" and insert therefor --preferably--;
col. 17, line 12, delete "prefrably" and insert therefor --preferably--;
col. 17, line 22, delete "lines ines w whereby" and insert therefor --lines whereby--;
col. 17, line 62, delete "elasped" and insert therefor --elapsed--; and
col. 17, line 65, delete "fiveport" and insert therefor --five-port--.
Col. 18, line 6, delete "threeway" and insert therefor --three-way--; and
col. 18, line 49, delete "a" and insert therefor --at--.
Col. 19, line 58, delete "ente" and insert therefor --enter--.
Col. 20, line 17, delete "mechancial" and insert therefor --mechanical--.

UNITED STATES PATENT AND TRADEMARK OFFICE
CERTIFICATE OF CORRECTION

PATENT NO. : 4,778,532
DATED : October 18, 1988
INVENTOR(S) : McConnell *et al.*

It is certified that error appears in the above-identified patent and that said Letters Patent is hereby corrected as shown below:

Col. 21, line 18, delete "tertbutanol" and insert therefor --tert-butanol--.
Claim 1, line 13, delete "requirement" and insert therefor --require--.
Claim 3, line 3, delete 'tially" and insert therefor --tially--.
Claim 7, line 1, delete "wheren" and insert therefor --wherein--.
Claim 10, line 2, delete "idizng" and insert therefor --idizing--.
Claim 18, line 2, delete "resevoir" and insert therefor --reservoir--.
Claim 38, line 3, delete "chemial" and insert therefor --chemical--.
Claim 46, line 1, delete "herein" and insert therefor --wherein--.
Claim 47, line 1, delete "wherien" and insert therefor --wherein--.
Claim 58, line 11, delete "is".

Signed and Sealed this

Thirtieth Day of May, 2000

Q. TODD DICKINSON

*Attest:*

*Attesting Officer*              *Director of Patents and Trademarks*